(12) United States Patent
Basler et al.

(10) Patent No.: US 9,979,187 B2
(45) Date of Patent: May 22, 2018

(54) POWER DEVICE WITH OVERVOLTAGE ARRESTER

(71) Applicant: Infineon Technologies Austria AG, Villach (AT)

(72) Inventors: Thomas Basler, Riemerling (DE); Edward Fuergut, Dasing (DE); Stephan Voss, Munich (DE)

(73) Assignee: Infineon Technologies Austria AG, Villach (AT)

( * ) Notice: Subject to any disclaimer, the term of this patent is extended or adjusted under 35 U.S.C. 154(b) by 204 days.

(21) Appl. No.: 14/939,734

(22) Filed: Nov. 12, 2015

(65) Prior Publication Data
US 2017/0141567 A1    May 18, 2017

(51) Int. Cl.
*H02H 1/00* (2006.01)
*H02H 9/04* (2006.01)

(52) U.S. Cl.
CPC ..... *H02H 9/046* (2013.01); *H01L 2924/1301* (2013.01); *H02H 9/04* (2013.01); *H02H 9/041* (2013.01); *H02H 9/042* (2013.01)

(58) Field of Classification Search
USPC .................. 361/117–119, 212, 220
See application file for complete search history.

(56) References Cited

U.S. PATENT DOCUMENTS

| | | | | |
|---|---|---|---|---|
| 6,353,236 B1 * | 3/2002 | Yatsuo | ............ | H01C 7/10 257/119 |
| 7,180,719 B2 * | 2/2007 | Whitney | ............ | H01C 7/021 361/103 |
| 8,466,561 B2 | 6/2013 | Otremba | | |
| 8,916,474 B2 | 12/2014 | Otremba et al. | | |
| 9,159,720 B2 | 10/2015 | Otremba | | |
| 2011/0261536 A1 * | 10/2011 | Feichtinger | ............ | H01C 1/084 361/713 |
| 2013/0161801 A1 | 6/2013 | Otremba et al. | | |
| 2014/0001615 A1 | 1/2014 | Otremba et al. | | |
| 2014/0028192 A1 | 1/2014 | Dehe et al. | | |
| 2014/0138803 A1 | 5/2014 | Otremba et al. | | |
| 2015/0084080 A1 * | 3/2015 | Kawakita | ............ | H01L 25/167 257/98 |

FOREIGN PATENT DOCUMENTS

| | | |
|---|---|---|
| DE | 102006034679 A1 | 1/2008 |
| DE | 102012112769 A1 | 6/2013 |
| DE | 102013106577 A1 | 1/2014 |
| DE | 102013112592 A1 | 5/2014 |
| DE | 102014102006 A1 | 8/2014 |

OTHER PUBLICATIONS

"Recommendations for Assembly of Infineon to Packages, Additional Information" Infineon Technologies AG, R 2.0, Jan. 7, 2015, 22 pp.

* cited by examiner

*Primary Examiner* — Danny Nguyen
(74) *Attorney, Agent, or Firm* — Shumaker & Sieffert, P.A.

(57) ABSTRACT

An example power device includes a semiconductor chip and an arrester element configurable to, in response to a voltage across the arrester element being greater than a threshold voltage, create a current path around an isolation layer configured to electrically isolate the semiconductor chip from a heat sink configured to dissipate heat generated by the semiconductor chip. In this example power device, the threshold voltage is less than a breakdown voltage of the isolation layer.

17 Claims, 4 Drawing Sheets

POWER DEVICE WITH OVERVOLTAGE ARRESTER

TECHNICAL FIELD

This disclosure relates to power electronic systems, and in particular, to electronic safety systems that protect power electronic systems against voltage overstress.

BACKGROUND

In many power electronic circuits, the components of the power circuits (e.g. in a TO package, Power Module, Intelligent Power Module (IPM), quad flat package (QFP), quad flat no-lead package (QFN), driver package, surface mount (SMT) package, Isolated Metal Substrate (IMS), or other power circuit components) can be damaged or destroyed if they experience a voltage overstress (i.e., exceed a particular voltage level). In some examples, components of a power circuit may experience a voltage overstress as a result of an over voltage in a supply system of the power circuit. One example of an event that may cause components in a power circuit to experience a voltage overstress are voltage transients as a result of a lightning strike.

SUMMARY

In one example, a power device includes a semiconductor chip; and an arrester element configurable to, in response to a voltage across the arrester element being greater than a threshold voltage, create a current path around an isolation layer configured to electrically isolate the semiconductor chip from a heat sink configured to dissipate heat generated by the semiconductor chip, wherein the threshold voltage is less than a breakdown voltage of the isolation layer.

In another example, a system includes a power device comprising a semiconductor chip; a heat sink configured to dissipate heat generated by the semiconductor chip; and an isolation layer configured to electrically isolate the semiconductor chip from the heat sink. In this example, the power device also includes an arrester element configurable to, in response to a voltage across the arrester element being greater than a threshold voltage, create a current path around the isolation layer, wherein the threshold voltage is less than a breakdown voltage of the isolation layer.

In another example, a method includes creating, by an arrester element of a power device and in response to a voltage across the arrester element being greater than a threshold voltage, a current path around an isolation layer that is configured to electrically isolate a semiconductor chip of the power device from a heat sink configured to dissipate heat generated by the semiconductor chip, wherein the threshold voltage is less than a breakdown voltage of the isolation layer.

Details of these and other examples are set forth in the accompanying drawings and the description below. Other features, objects, and advantages will be apparent from the description and drawings, and from the claims.

DETAILED DESCRIPTION

Figure 1:
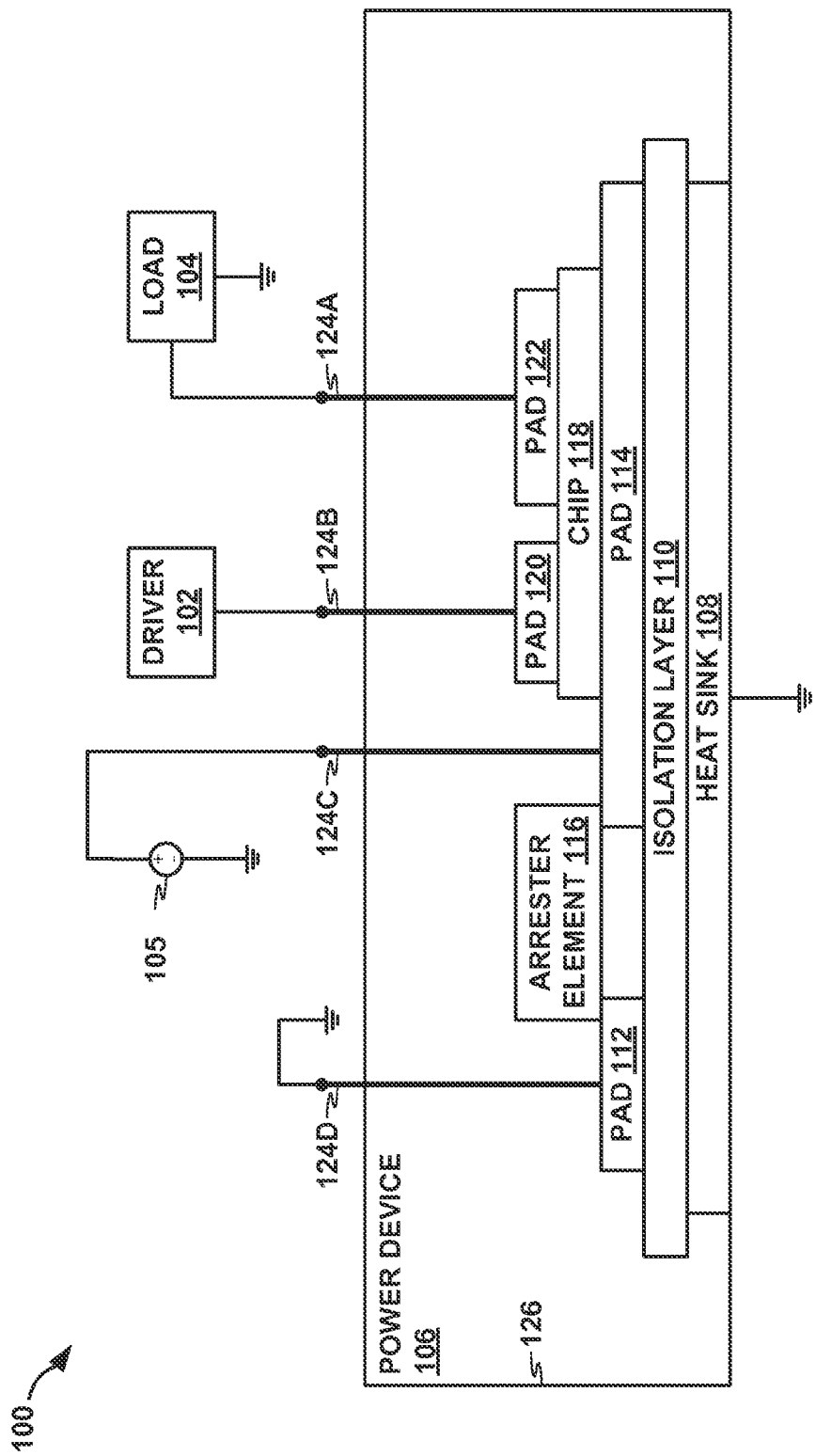
FIG. 1 is a conceptual diagram illustrating a power system that includes a power device having an arrester element, in accordance with one or more techniques of this disclosure.

In general, this disclosure is directed to techniques for protecting components of a power device from voltage overstress. For instance, one or more components may be positioned externally to a power device to be protected or at an input to a power circuit that includes the power device. As one example, where the power device to be protected is a transistor, a varistor or suppressor diode may be placed across a collector leg and an emitter leg of the transistor. In this way, the varistor or suppressor diode may prevent the collector-emitter voltage from exceeding a threshold (i.e., a breakdown voltage of the varistor or suppressor diode). However, in some examples, it may not be desirable for the protecting components to be positioned externally from the power device to be protected. As one example, externally positioned components may occupy board space and increase the bill-of-materials (BOM) length. As another example, externally positioned components may increase lead to increased parasitics (L,C) in the protection path. As another example, externally positioned components may fail to prevent an isolation layer from experiencing overvoltage (pre)-damage or a complete breakdown. As another example, externally positioned components may provide a designer of a system that includes the power device with a limited range of voltages available and/or may have to use a series connection of multiple arrester elements.

Additionally, as power devices generate heat during operation, some power devices include heat sinks to dissipate heat generated by the power devices. In some examples, a power device may further include insulation to electrically isolate the power device from the heat sink. For instance, an insulated package power device may include an isolation layer, also referred to as insulation layers, configured to prevent current from flowing into the heat sink from the power device. In some examples, the isolation layer may be made from one or more of BrN, ceramic layer, Al2O3, AlN, Si4N3, diamond, a composite material resin (e.g., epoxy, silicone, cyanate ester, BMI, polyimide), and may have a filler (SiO, Al2O3, AlN, Si4N3, or diamond), or another electrically insulating material. In some examples, the isolation layer may comprise one or more of a molded layer (e.g., a thermal conductive mold compound as isolation), a molding sheet, external isolation, isolation sheet (e.g. TIM), isolated heat sink, PCB, IMS, DCB (direct copper bonded), DAB (direct aluminum bonded) system. However, if the voltage across the isolation layer exceeds the breakdown voltage of the isolation layer, current may flow through the isolation layer into the heat sink. Once the isolation layer breaks down (i.e., allows current to flow into the heat sink), the isolation layer may become permanently damaged. As such, it may be desirable to design an isolation layer with a high breakdown voltage such that the power device is not permanently damaged as a result of a single voltage overstress.

In some examples, the breakdown voltage of the isolation layer may be dependent on the thickness of the isolation layer. For instance, within a particular material, a thicker isolation layer may have a higher breakdown voltage than a thinner isolation layer. As such, the thickness of the isolation layer may be adjusted in order to achieve a particular breakdown voltage.

However, in some examples, it may not be desirable for a power device to include a thick isolation layer. For instance, the thermal resistance of the isolation layer may be proportional to the thickness of the isolation layer. In other words, a thicker isolation layer may prevent more heat from flowing to the heat sink than a thinner isolation layer. Additionally, thicker isolation layers may be more expensive to produce than thinner isolation layers. As one example, the isolation layer material may be expensive. As another example, a thicker isolation layer may also require an expensive filler material. As such, it may be desirable for a power device to not become permanently damaged as a result of a single voltage overstress while also including a thin isolation layer.

In accordance with one or more techniques of this disclosure, a power device may include an arrester element configured to create a current path around an isolation layer of the power device when a voltage across the isolation layer exceeds a threshold voltage that is less than a breakdown voltage of the isolation layer. For instance, where the voltage across the arrester element may be substantially the same as the voltage across the isolation layer (e.g., both the arrester element and the heat sink may be at the same potential), the arrester element may allow current to flow around the isolation layer before the voltage across the isolation layer exceeds the breakdown voltage of the isolation layer.

In some examples, the arrester element may be configured to create the current path multiple times without becoming permanently damaged (i.e., for a certain amount of dissipated energy). For instance, Where the arrester element includes a suppressor diode, the suppressor diode may be able to breakdown (i.e., and allow current to flow through the arrester element) multiple times (e.g., 10 times, 100 times, 1000, times, 5000 times, 50000 times, etc.) without becoming permanently damaged. As the arrester element may allow current to flow around the isolation layer before the voltage across the isolation layer exceeds the breakdown voltage of the isolation layer, the thickness of the isolation layer may be reduced to provide isolation for operation class voltages (i.e., voltages at which the power device operates) while the arrester element provides protection against safety class voltages (i.e., voltages that would damage the power device). In some examples, the arrester element may include a thyristor-like device. In such examples, if the overvoltage is high enough, the path may be shorted since the thyristors is ignited overhead (e.g., the emitter to collector path of an IGBT may shorted and thus the device maybe protected from too high voltages). In this way, the safety class of the power device may be maintained while increasing the amount of heat that can flow into the heat sink. Also in this way, the arrester element may be adjusted (e.g., by a manufacturer of the power device) to fit the breakdown voltage of the isolation layer and/or the breakdown voltage of the semiconductor.

FIG. 1 is a conceptual diagram illustrating a power system that includes a power device having an arrester element, in accordance with one or more techniques of this disclosure. As illustrated in the example of FIG. 1, system 100 may include driver 102, load 104, power supply 105, and power device 106.

System 100 may include load 104, which may be configured to be selectively receive power from power supply 105 via power device 106. For instance, in the example of FIG. 1, load 104 may selectively receive power from power supply 105. System 100 may include driver 102, which may be configured to control operation of power device 106. For instance, where power device 106 includes a transistor, driver 102 may output a signal to a gate of the transistor that causes the transistor to provide power to load 104.

System 100 may include power device 106, which may be configured to selectively control the amount of power provided to a device. For instance, in the example of FIG. 1, power device 106 may operate as a high-side switch that selectively controls the amount of power provided to load 104 from power supply 105. Examples of power device 106 include, but are not limited to, discrete packages, power modules, and intelligent power modules (IPMs). As illustrated in FIG. 1, power device 106 may include heat sink 108, isolation layer 110, pad 112, pad 114 (i.e., the collector pad), arrester element 116, semiconductor chip 118 ("chip 118"), pad 120 (i.e., the gate pad), pad 122 (i.e., the emitter/source pad), terminal legs 124A-124D (collectively, "terminal legs 124"), and housing 126.

Power device 106, in some examples, may include housing 126, which may be configured to package one or more components of power device 106. For instance, as shown in the example of FIG. 1, housing 126 may enclose heat sink 108, isolation layer 110, pad 112, pad 114, arrester element 116, chip 108, pad 120, pad 122, and terminal legs 124. In some examples, housing 126 may comprise an epoxy, a plastic, or any other material suitable for containing components of power device 106.

Power device 106, in some examples, may include terminal legs 124, each of which may be configured to provide an electrical connection between power device 106 and an external component. For instance, each of terminal legs 124 may be configured to provide a connection between power device 106 and another object, such as a trace or a thru-hole tin a printed circuit board (PCB) or a bar on a busbar system. In some examples, terminal legs 124 may be referred to as leads, pins, or connectors. As shown in FIG. 1, one or more of terminal legs 124 may cross through housing 126.

Together, the type of housing 126 and terminal legs 124 included in power device 106 may be considered to be the package of power device 106. Some example packages that may be formed by housing 126 and terminal legs 124 include, but are not limited to transistor outline (TO) packages (e.g., TO92, TO218, TO220, TO262, TO247-3 pin, TO247-4 pin, TO220FP, TO251, TO263, TO252), quad flat package (QFP), quad flat no-lead package (QFN), driver package, surface mount (SMT) package, Isolated Metal Substrate (IMS), power modules such as integrated power modules (IPMs), wafer level, chip embedding into PCB, or any other suitable package.

Power device 106, in some examples, may include chip 118, which may be configured to selectively control the amount of power provided to a device. In some examples, chip 118 may include one or more power transistors, one or more metal-oxide-semiconductor field-effect transistors (MOSFETs), one or more gallium nitride (GaN) switches, one or more thyristors, one or more insulated-gate bipolar transistors (IGBTs), one or more diodes (e.g., pin diodes), and/or a combination of the same. Some example MOSFETs that may be included in chip 118 include, but are not limited to, one or more double-diffused metal-oxide-semiconductor (DMOS) MOSFETs, one or more P-substrate (PMOS) MOSFETs, one or more trench (UMOS) MOSFETS, and one or more super-junction deep-trench MOSFETs (e.g., one or more CoolMOS™ MOSFETs). Depending on the use case, chip 118 may be configured to operate at difference voltage levels (e.g., 50V, 500V, 600V, . . . 1 kV, 5 kV, 6.5 kV, 10 kV, 20 kV (SiC devices) etc.).

Power device 106, in some examples, may include pad 114, pad 120, and pad 122, each of which may be configured to provide an electrical connection to chip 118. For instance, where chip 118 is an IGBT, pad 114 may provide the collector connection, pad 122 may provide the emitter connection, and pad 120 may provide the gate connection. In some examples, the potential at pad 114 may be referred to as the bottom potential of chip 118. Similarly, in some examples, the potential at pad 122 may be referred to as the top potential of chip 118. In some examples, one or more of pad 114, pad 120, and pad 122 may be made from aluminum, copper, silver, or gold.

In some examples, chip 118 may generate heat during operation. However, the functionality of chip 118 may be adversely affected by high temperatures. As one example, the amount of power that may be controlled by chip 118 may be reduced at high temperatures. As another example, chip 118 may be permanently damaged as a result of high temperatures. As such, it may be desirable to quickly dissipate heat generated by chip 118.

Power device 106, in some examples, may include heat sink 108, which may be configured to dissipate heat generated by one or more components of power device 106. For instance, heat sink 108 may be configured to dissipate heat generated by chip 118 of power device 106. While illustrated in FIG. 1 as a component of power device 106, in some examples heat sink 108 may be a separate component. Alternatively, in some examples, power device 106 may include heat sink 108 and system 100 may include an additional heat sink which may be additionally configured to dissipate heat generated by power device 106. In some examples, heat sink 108 may be made from aluminum (Al), copper (Cu), aluminum silicon carbide (AlSiC), and may be water cooled, air cooled, or may be a heat-pipe.

System 100, in some examples, may include isolation layer 110. While illustrated in the example of FIG. 1 as being included in power device 106, in other examples isolation layer 110 may not be included in power device 106. Isolation layer 110 may be configured to electrically isolate one or more components of power device 106. For instance, isolation layer 110 may prevent current from flowing from chip 118 (along with pads 112, 114, 120, and 122) and arrester element 116 into heat sink 108. In some examples, isolation layer 110 may electrically isolate the components so long as the voltage across isolation layer 110 does not exceed a breakdown voltage of isolation layer 110. For instance, if the voltage across isolation layer 110 exceeds the breakdown voltage of isolation layer 110, current may flow through isolation layer 110 into heat sink 108. Once isolation layer breaks down 110 (i.e., allows current to flow into heat sink 108), isolation layer 110 may become permanently damaged (i.e., may no longer be able to electrically isolate the components of power device 106 and/or may completely fail). As such, it may be desirable for isolation layer 110 to have a high breakdown voltage such that power device 106 is not permanently damaged as a result of a single voltage overstress.

In some examples, the breakdown voltage of isolation layer 110 may be dependent on the thickness of isolation layer 110. For instance, within a particular material, a thicker isolation layer may have a higher breakdown voltage than a thinner isolation layer. As such, it may be desirable to have a relatively thick isolation layer 110 in order prevent isolation layer 110 from becoming permanently damaged.

In addition to electrically isolating the components, isolation layer 110 may provide one or more functions. For instance, isolation layer 110 may allow heat to flow from chip 118 to heat sink 108. In some examples, it may be desirable for isolation layer 110 to have as low a thermal resistance ($R_{th}$) as possible. For instance, it may be desirable for isolation layer 110 to allow a maximum level of heat to flow from chip 118 to heat sink 108 in order to improve the operation of chip 118 by reducing the amount of heat retained by chip 118. In some examples, the thermal resistance of isolation layer 110 may be proportional to the thickness of isolation layer 110. In other words, a thicker isolation layer 110 may have higher thermal resistance, and prevent more heat from flowing to heat sink 108, than a thinner isolation layer 110. As discussed above, it may be desirable to quickly dissipate heat generated by chip 118. As such, it may be desirable to have a relatively thin isolation layer 110 (i.e., in order prevent chip 118 from overheating).

In some examples, isolation layer 110 may be made of one or more insulating materials, such as $Al2O3$, boron nitride (BN), aluminum nitride (AlN), or another electrically insulating material. In some examples, the insulating materials may be relatively expensive. By reducing the thickness of isolation layer 110, however, the amount of material used to create isolation layer 110 may also be reduced. As such, in addition to being desirable to reduce the thickness of isolation layer 110 to reduce the thermal resistance of isolation layer 110, it may also be desirable to reduce the thickness of isolation layer 110 to reduce the cost of power device 106.

In accordance with one or more techniques of this disclosure, power device 106 may include arrester element 116, which may be configured to create a current path around isolation layer 110 when a voltage across isolation layer 110 exceeds a threshold voltage that is less than a breakdown voltage of isolation layer 110. For instance, as illustrated in FIG. 1, arrester element 116 may create a current path between pad 114 and terminal leg 124D in response to a voltage across arrester element 116 exceeding a threshold. In some examples, the voltage across arrester element 116 may be substantially the same as the voltage across isolation layer 110. For instance, as shown in the example of FIG. 1, arrester element 116 may be connected across pad 114 and pad 112, and pad 112 may be connected to terminal leg 124D, which is connected to ground. As heat sink 108 is also connected to ground (i.e., where terminal leg 124D and heat sink 108 are at the same potential), the voltage across isolation layer 110 may be substantially the same as the voltage across arrester element 116. Therefore, when the voltage across arrester element 116 exceeds the threshold voltage, arrester element 116 may create a current path from pad 114 to terminal leg 124D. In some examples, the amount time taken to create the current path from pad 114 to terminal leg 124D may be less than an amount of time needed for isolation layer 110 to breakdown. In this way, arrester element 116 may allow current to flow around isolation layer 110 before the voltage across isolation layer 110 exceeds the breakdown voltage of isolation layer 110. As arrester element 116 prevents isolation layer 110 from breaking down due to voltage overstress events, the breakdown voltage, and thus the thickness, of isolation layer 110 may be reduced (i.e., reduced by 10%, 20%, 30%, 40%, 50%, 70%, etc). In this way, the thermal resistance and/or cost of isolation layer 110 may be reduced.

Examples of arrester element 116 include, but are not limited to, voltage suppressor diodes (e.g., transient voltage suppressor (TVS) diodes), varistors, spark gaps, field emission components, or any other component capable of selectively creating a current path based on a voltage drop. As one example, where arrester element 116 includes a voltage suppressor diode, the breakdown voltage of the voltage suppressor diode may be selected to be less than the breakdown voltage of isolation layer 110. As another example, where arrester element 116 includes a varistor, the clamping voltage of the varistor may be selected to be less than the breakdown voltage of isolation layer 110.

As illustrated in the example of FIG. 1, arrester element 116 may be included within housing 126. In other words, in some examples, arrester element 116 may be included within a package of power device 106. In other examples, while still being included in power device 106, arrester element 116 may be attached to the outside of housing 126. In other words, in some examples, arrester element 116 may be included on a package of power device 106.

In operation, driver 102 may output a signal to terminal leg 124B that causes chip 118 of power device 106 to allow current to flow from power supply 105 to load 104. As a result of its operation, chip 118 may generate heat. This heat may pass through isolation layer 110 to heat sink 108 where the heat may be dissipated. As discussed above, the thickness of isolation layer 110 affects the amount of heat that may pass through isolation layer 110, and therefore affects the amount of heat retained by power device 106.

Power supply 105 may experience a voltage overstress and a voltage spike may propagate to power device 106. The voltage spike may cause the potential difference between pad 114 and ground to be greater than a threshold voltage. For instance, in the example of FIG. 1, the voltage spike may cause the potential difference between pad 114 and ground to be 3 kilo-volts (kV). The threshold voltage may be greater than the breakdown voltage of isolation layer 110, which in the example of FIG. 1, may be 2 kV.

However, arrester element 116 may be configured to shunt the current resulting from the voltage spike around isolation layer 110. For instance, in the example of FIG. 1, arrester element 116 may comprise a TVS diode, e.g., with a breakdown voltage of approximately 1.5 kV. As the breakdown voltage of arrester element 116 is less than the breakdown voltage of isolation layer 110, arrester element 116 may create a current path around isolation layer 110 before the voltage across isolation layer 110 exceeds the breakdown voltage of isolation layer 110.

While described above as 2 kV and 1.5 kV, the breakdown voltage of arrester element 116 and the breakdown voltage of isolation layer 110 are not so limited. As one example, in devices up to 300 V class, the breakdown voltage of isolation layer 110 may be approximately 600 V and the breakdown voltage of arrester element 116 may be approximately 500 V to 550 V. As another example, in devices in the 600 V to 650 V class, the breakdown voltage of isolation layer 110 may be approximately 1 kV and the breakdown voltage of arrester element 116 may be approximately 900 V. As another example, in devices in the 1200 V class, the breakdown voltage of isolation layer 110 may be approximately 2 kV and the breakdown voltage of arrester element 116 may be approximately 1.8 kV. As another example, in devices in the 1700 V class, the breakdown voltage of isolation layer 110 may be approximately 3 kV and the breakdown voltage of arrester element 116 may be approximately 2.5 kV. As another example, in devices in the 3.3 kV class, the breakdown voltage of isolation layer 110 may be approximately 6 kV and the breakdown voltage of arrester element 116 may be approximately 5 kV. As another example, in devices in the 6.5 kV class, the breakdown voltage of isolation layer 110 may be approximately 10.2 kV and the breakdown voltage of arrester element 116 may be approximately 9 kV.

Figure 2:
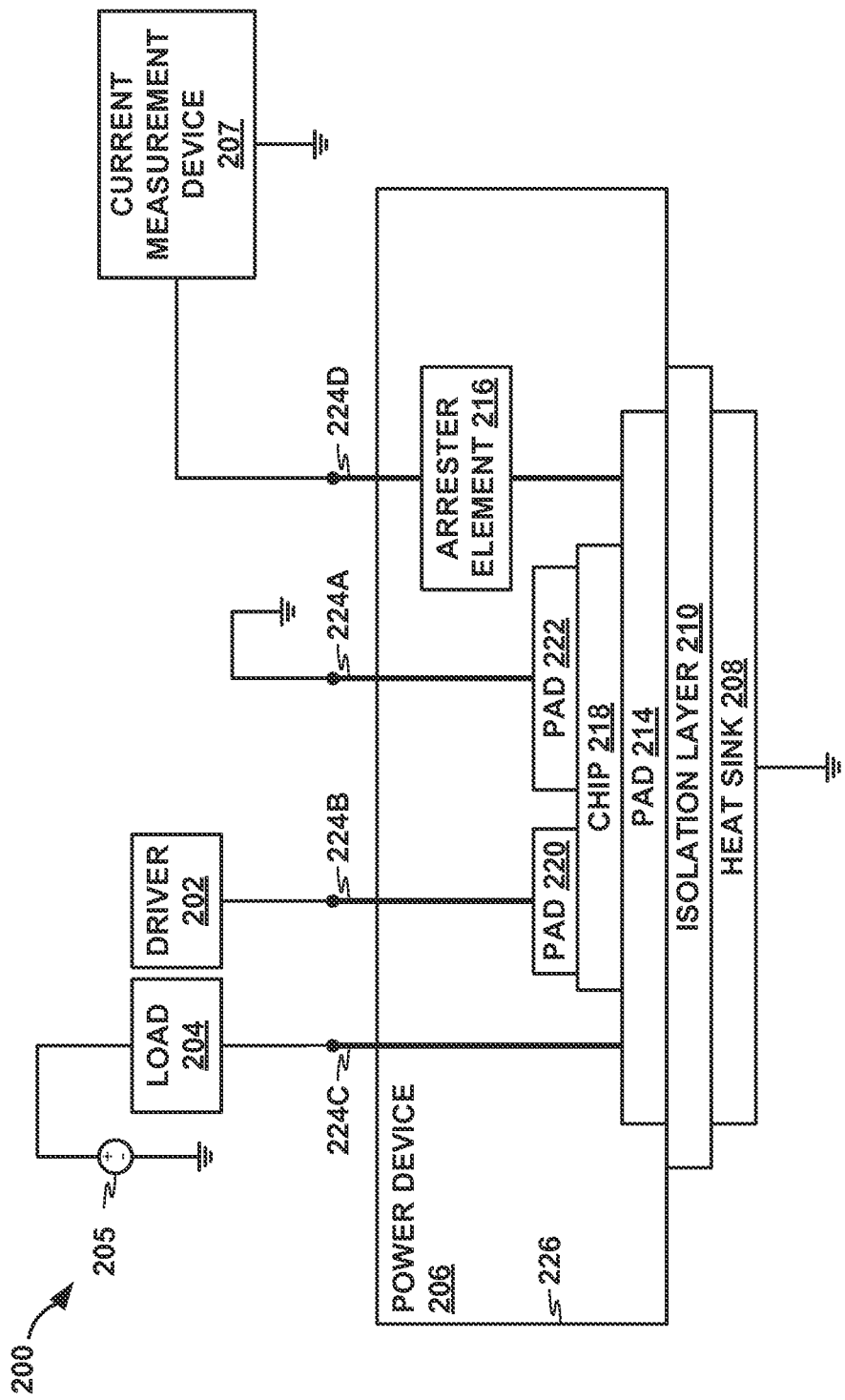
FIG. 2 is a conceptual diagram illustrating a power system that includes a power device having an arrester element, in accordance with one or more techniques of this disclosure.

FIG. 2 is a conceptual diagram illustrating a power system that includes a power device having an arrester element, in accordance with one or more techniques of this disclosure. As illustrated in the example of FIG. 2, system 200 may include driver 202, load 204, power supply 205, power device 206, and current measurement device 207.

System 200 may include driver 202, load 204, and power supply 205, which may be respectively configured to perform operations similar to driver 102, load 104, and power supply 105 of FIG. 1. For instance, driver 202 may be configured to control operation of power device 206, load 204 may be configured to be selectively receive power from power supply 205 via power device 206.

System 200 may include power device 206, which may be configured to perform operations similar to power device 106 of FIG. 1. For instance, power device 206 may be configured to selectively control the amount of power provided to a device. For instance, in the example of FIG. 2, power device 206 may operate as a low-side switch that selectively controls the amount of power provided to load 204 from power supply 205 (e.g. as a low-side switch in a half-bridge circuit in a converter application). Examples of power device 206 include, but are not limited to, discrete packages, power modules, and intelligent power modules (IPMs). As illustrated in FIG. 2, power device 206 may include pad 214, arrester element 216, semiconductor chip 218 ("chip 218"), pad 220, pad 222, terminal legs 224A-224D (collectively, "terminal legs 224"), and housing 226.

Heat sink 208, isolation layer 210, pad 214, arrester element 216, chip 218, pad 220, pad 222, terminal legs 224, and housing 226 may be respectively configured to perform operations similar to heat sink 108, isolation layer 110, pad 114, arrester element 116, chip 118, pad 120, pad 122, terminal legs 124, and housing 126 of FIG. 1. For instance, as discussed above and in accordance with one or more techniques of this disclosure, arrester element 216 of FIG. 2 may be configured to create a current path around isolation layer 210 when a voltage across isolation layer 210 exceeds a threshold voltage that is less than a breakdown voltage of isolation layer 210. In this way, arrester element 216 may allow current to flow around isolation layer 210 before the voltage across isolation layer 210 exceeds the breakdown voltage of isolation layer 210. As arrester element 216 prevents isolation layer 210 from breaking down due to voltage overstress events, the breakdown voltage, and thus the thickness, of isolation layer 210 may be reduced. In this way, the thermal resistance and/or cost of isolation layer 210 may be reduced.

As compared to example of FIG. 1 where heat sink 108 and isolation layer 110 are shown as being included in power device 106, in the example of FIG. 2, heat sink 208 and isolation layer 210 are illustrated as being separate (i.e., not included in) power device 206. Different arrangements may be possible in other examples. For instance, a power device may include an isolation layer but not include a heat sink.

In some examples, it may be desirable for system 200 to perform one or more actions in response to a voltage overstress event. For instance, it may be desirable for system 200 to deactivate/shutdown one or more components of system 200, such as power device 206, in response to a voltage overstress event.

In accordance with one or more techniques of this disclosure, system 200 may include current measurement device 207, which may be configured to measure a current flowing through arrester element 216. As discussed above, current may flow through arrester element 216, and thus terminal leg 224D, when arrester element is creating a current path around isolation layer 210 in response to a voltage overstress. Therefore, current flowing through arrester element 216 may indicate the occurrence of a voltage overstress within power device 206. As such, in response to current measurement device 207 detecting current flowing through arrester element 216, system 220 may deactivate/shutdown power device 206. For instance, in response to current measurement device 207 detecting current flowing through arrester element 216, driver 202 may output a signal that causes power device 206 to deactivate/shutdown. In some examples, current measurement device 207 may include a resistor, such as a sense or shunt resistor, that couples terminal leg 224D to ground, rogowski coils, hail sensors, or any other components capable of measuring a current.

In some examples, such as the example of FIG. 2, current measurement device 207 may be external to power device 206. In some examples, current measurement device 207 may be integrated into a package of power device 206.

In some examples, in addition to including arrester element 216 to protect isolation layer 210 from voltage overstress, power device 206 may include additional arrester elements to protect other components of power device 206. As one example, an additional arrester element, such as a suppressor diode, having a smaller breakdown voltage than chip 218 can be connected across terminal legs 224A and 224C the collector and the emitter). As such, the additional arrester element may shunt current around chip 218 when the voltage across the collector and the emitter of chip 218 exceeds the breakdown voltage of the additional arrester element. For instance, where the breakdown voltage of chip 218 is 1200V, the additional arrestor element may be selected and/or configured to have a breakdown voltage less than 1200V. In this way, the additional arrester element may prevent chip 218 from becoming damaged due to voltage overstress.

As another example, an additional arrester element may be connected across terminal legs 224A and 224B the emitter and the gate). As such, the additional arrester element may shunt current around chip 218 when the voltage across the gate and the emitter of chip 218 exceeds the breakdown voltage of the additional arrester element, which may be selected to be less than the breakdown voltage of chip 218.

As another example, power device 206 may include an arrester element for each terminal leg. For instance, power device 206 may include a first arrester element connected across terminal legs 224A and 224C, and a second arrester element connected across terminal legs 224B and 224C. In some examples, as opposed to being connected to a fourth terminal leg (i.e., terminal leg 224C), one or more of the arrester elements may be connected to a backside of housing 226. In this way, all legs of power device 206 may be protected.

In some examples, current measurement device 207 or another current measurement device may be configured to measure a current flowing through one or more of the additional arrester elements. In response to current flowing through one or more of the additional arrester elements, system 200 may deactivate/shutdown power device 206. For instance, system 200 may include a sense resistor connected between terminal leg 224D and terminal leg 224A. In some of such examples, power device 206 may include another terminal leg which may be used to sense the current flowing from a collector of chip 218 to an emitter of chip 218.

In some examples, one or more of the additional arrester elements may be included within housing 226. In some examples, one or more of the additional arrester elements may be attached to housing 226.

Figure 3C:
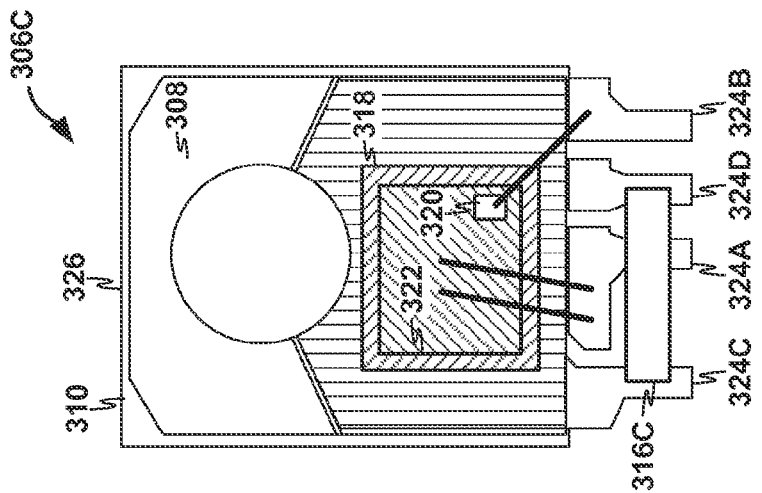
FIGS. 3A-3C are conceptual diagrams illustrating example configurations of power devices having an arrester element, in accordance with one or more techniques of this disclosure.
Figure 3B:
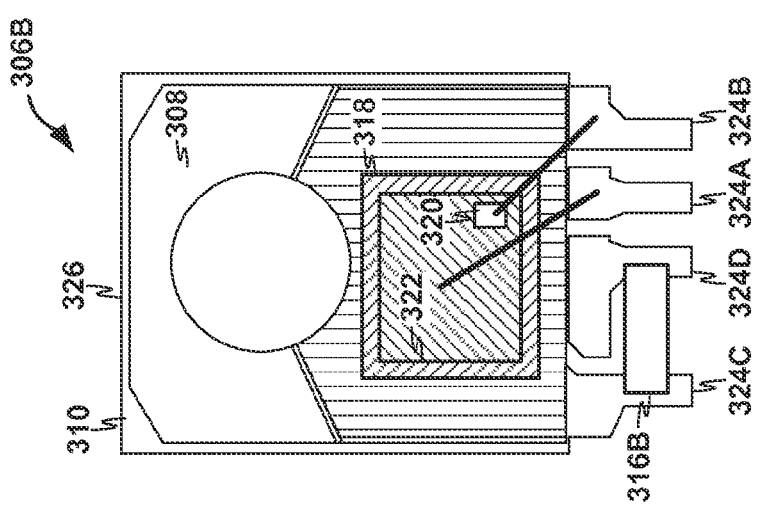
Figure 3A:
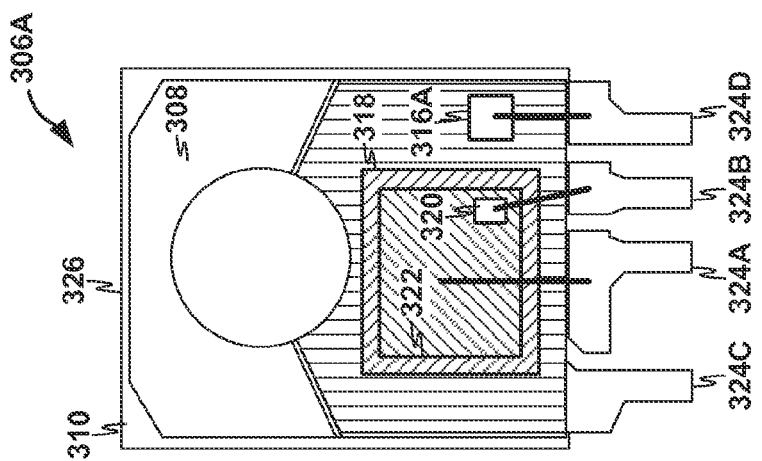

FIGS. 3A-3C are conceptual diagrams illustrating example configurations of power devices having an arrester element, in accordance with one or more techniques of this disclosure. As shown in FIGS. 3A-3C, power devices 306A-306C may each include a chip carrier 308, chip 318, isolation layer 310 disposed between chip carrier 308 and a heat sink, pad 314, pad 320, pad 322, an arrester element of arrester elements 316A-316C (collectively, "arrester elements 316"), terminal legs 324A-324C (collectively, "terminal legs 324"), and housing 326. Each of chip 318, isolation layer 310, pad 314, pad 320, pad 322, arrester elements 316, terminal legs 324, and housing 326 may be configured to perform operations similar to chip 118/218, isolation layer 110/210, pad 114/214, pad 120/220, pad 122/222, arrester element 116/216, and terminal legs 124/224 of FIG. 1 and FIG. 2. In some examples, such as the examples of FIGS. 3A-3C, isolation layer 310 may be positioned below chip 318 and below a carrier of chip 318 and/or a lead-frame. In some examples, each of power devices 306A-306C may also include a heat sink disposed under isolation layer 310 which may be configured to perform operations similar to heat sink 108/208 of FIG. 1 and FIG. 2. In some examples, isolation layer 310 may be included within housing 326. In some examples, isolation layer 310 may be included as a separate isolation foil.

As discussed above, in some examples, an arrester element maybe included within a housing of a power device. For instance, as shown in FIG. 3A, arrester element 316A may be included within housing 326 of power device 306A. Alternatively, as discussed above, in some examples, an arrester element maybe attached to an exterior of a housing of a power device. For instance, as shown in FIGS. 3B and 3C, arrester elements 316B and 316C may be respectively attached to an exterior of housing 326 of power devices 306B and 306C. In some examples, such as where arrester elements 316B and 316C are respectively attached to the leads (or close to the packages) of power devices 306B and 306C, arrester elements 316B and 316C may be completely molded. In some examples, by externally attaching arrester elements to a power device, a designer of a system that includes the power device may be provided with a degree of freedom as to whether or not to use protection functions.

In some examples, terminal leg 324D may be connected to ground or to terminal leg 324A, which may be the emitter potential of chip 318. In this way, a designer of a system that the power devices may select which path of the complete device should be protected.

In some examples, the inclusion of an additional terminal leg (i.e., terminal leg 324C) may provide one or more advantages. As one example, by including an additional terminal leg, a manufacturer of the power device can test the arrester element independently of the power semiconductor (e.g. during a final backend test). As another example, the isolation layer may be measured independently from the arrester element with a certain safety margin.

Figure 4:
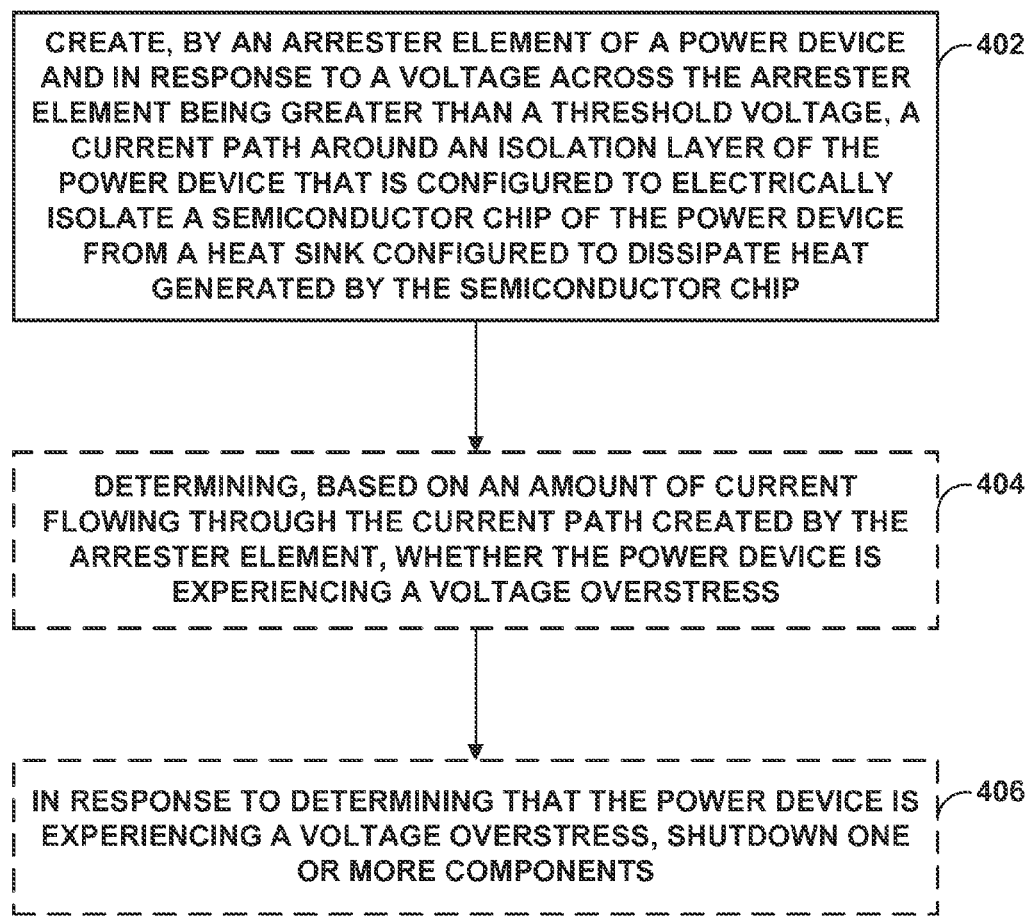
FIG. 4 is a flow diagram illustrating an example technique for diverting current around an isolation layer of a power device, in accordance with one or more techniques of this disclosure.

FIG. 4 is a flow diagram illustrating an example technique for diverting current around an isolation layer of a power device, in accordance with one or more techniques of this disclosure. For purposes of illustration only, the example operations are described below within the context of power device 106, as shown in FIG. 1.

In accordance with one or more techniques of this disclosure, arrester element 116 of power device 106 may create, in response to a voltage across arrester element 116 being greater than a threshold voltage, a current path around isolation layer 110 of power device 106 that is configured to electrically isolate semiconductor chip 118 of power device 106 from heat sink 108 (402). As discussed above, the threshold voltage may be less than a breakdown voltage of isolation layer 110. Therefore, arrester element 116 may allow current to flow around isolation layer 110 before the voltage across isolation layer 110 exceeds the breakdown voltage of isolation layer 110. As arrester element 116 prevents isolation layer 110 from breaking down due to voltage overstress events, the breakdown voltage, and thus the thickness, of isolation layer 110 may be reduced. In this way, the thermal resistance and/or cost of isolation layer 110 may be reduced.

In some examples, driver 202 may determine, based on an amount of current flowing through the current path created by arrester element 116, whether power device 106 is experiencing a voltage overstress (404). For instance, a current measurement device, such as current measurement device 207 of FIG. 2, may determine the amount of current flowing through arrester element 116. If the amount of current flowing through arrester element 116 is greater than a threshold current level, driver 202 may determine that power device 106 is experiencing a voltage overstress, in response to determining that power device 106 experiencing a voltage overstress, driver 202 may shutdown one or more components of system 100, such as power device 106 and/or power supply 105 (406). In some examples, driver 202 (or another component of system 100) may also count a number of times that power device 106 has experienced a voltage overstress (i.e., a number of breakdowns) and may output one or more alerts if the number exceeds a threshold. In this way, in response to determining that power device 106 is experiencing a voltage overstress, driver 102 may deactivate one or more components of a system that includes power device 106.

The following numbered examples may illustrate one or more aspects of the disclosure:

Example 1

A power device comprising: a semiconductor chip; and an arrester element configurable to, in response to a voltage across the arrester element being greater than a threshold voltage, create a current path around an isolation layer configured to electrically isolate the semiconductor chip from a heat sink configured to dissipate heat generated by the semiconductor chip, wherein the threshold voltage is less than a breakdown voltage of the isolation layer.

Example 2

The power device of example 1, further comprising: a plurality of terminal legs, wherein: the semiconductor chip is connected to at least two terminal legs of the plurality of the terminal legs, and to create the current path around the isolation layer, the arrester element is configured to create a current path from the semiconductor chip to an additional terminal leg of the plurality of terminal legs that is different than the at least two terminal legs.

Example 3

The power device of any combination of examples 1-2, wherein, to create the current path from the semiconductor chip to the additional terminal leg, the arrester element is configured to create a current path from a bottom potential of the semiconductor chip to the additional terminal leg.

Example 4

The power device of any combination of examples 1-3, wherein the arrester element is disposed within a housing of the power device.

Example 5

The power device of any combination of examples 1-3, wherein the arrester element is disposed on a housing of the power device.

Example 6

The power device of any combination of examples 1-5, wherein the semiconductor chip comprises one or more insulated-gate bipolar transistors (IGBTs), one or more metal-oxide-semiconductor field-effect transistors (MOSFETS), and/or one or more diodes.

Example 7

The power device of any combination of examples 1-6, wherein the semiconductor chip comprises a plurality of semiconductor chips.

Example 8

The power device of any combination of examples 1-7, wherein the arrester element comprises one or more varistors, one or more transient voltage suppressor (TVS) diodes, one or more thyristors, and/or one or more spark gaps.

Example 9

A system comprising: a power device comprising a semiconductor chip; a heat sink configured to dissipate heat generated by the semiconductor chip; and an isolation layer configured to electrically isolate the semiconductor chip from the heat sink, wherein the power device further comprises: an arrester element configurable to, in response to a voltage across the arrester element being greater than a threshold voltage, create a current path around the isolation layer, wherein the threshold voltage is less than a breakdown voltage of the isolation layer.

Example 10

The system of example 9, wherein the power device further comprises: a plurality of terminal legs, wherein: the semiconductor chip is connected to at least two terminal legs of the plurality of the terminal legs, and to create the current path around the isolation layer, the arrester element is configured to create a current path from the semiconductor chip to an additional terminal leg of the plurality of terminal legs that is different than the at least two terminal legs.

Example 11

The system of any combination of examples 9-10, further comprising: a current measurement device configured to measure a current flowing through the created current path.

Example 12

The system of any combination of examples 9-11, wherein the semiconductor chip comprises a plurality of semiconductor chips.

Example 13

A method comprising: creating, by an arrester element of a power device and in response to a voltage across the arrester element being greater than a threshold voltage, a current path around an isolation layer that is configured to electrically isolate a semiconductor chip of the power device from a heat sink configured to dissipate heat generated by the semiconductor chip, wherein the threshold voltage is less than a breakdown voltage of the isolation layer.

Example 14

The method of example 13, wherein the power device comprises a plurality of terminal legs, the semiconductor chip is connected to at least, two terminal legs of the plurality of the terminal legs, and creating the current path around the isolation layer comprises: creating a current path from the semiconductor chip to an additional terminal leg of the plurality of terminal legs that is different than the at least two terminal legs.

Example 15

The method of any combination of examples 13-14, further comprising: determining, based on a current flowing created current path, that the power device is experiencing a voltage overstress; and in response to determining that the power device is experiencing a voltage overstress, deactivating one or more components of a system that includes the power device.

Example 16

The method of any combination of examples 13-15, wherein creating the current path from the semiconductor chip to the additional terminal leg comprises: creating, by the arrester element, a current path from a bottom potential of the semiconductor chip to the additional terminal leg.

Example 17

The method of any combination of examples 13-16, wherein the arrester element is disposed within a housing of the power device.

Example 18

The method of any combination of examples 13-16, wherein the arrester element is disposed on a housing of the power device.

Example 19

The method of any combination of examples 13-18, wherein the semiconductor chip comprises one or more insulated-gate bipolar transistors (IGBTs), one or more metal-oxide-semiconductor field-effect transistors (MOSFETS), and/or one or more diodes.

Example 20

The method of any combination of examples 13-19, wherein the arrester element comprises one or more varistors, one or more transient voltage suppressor (TVS) diodes, one or more thyristors, and/or one or more spark gaps.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules, or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

Various aspects have been described in this disclosure. These and other aspects are within the scope of the following claims.

The invention claimed is:

1. A power device comprising:
   a plurality of terminal legs;
   a semiconductor chip connected to at least two terminal legs of the plurality of terminal legs; and
   an arrester element configurable to, in response to a voltage across the arrester element being greater than a threshold voltage, create a current path around an isolation layer configured to electrically isolate the semiconductor chip from a heat sink configured to dissipate heat generated by the semiconductor chip, wherein the threshold voltage is less than a breakdown voltage of the isolation layer, and wherein, to create the current path around the isolation layer, the arrester element is configured to create a current path from the semiconductor chip to an additional terminal leg of the plurality of terminal legs that is different than the at least two terminal legs.

2. The power device of claim 1, wherein, to create the current path from the semiconductor chip to the additional terminal leg, the arrester element is configured to create a current path from a bottom potential of the semiconductor chip to the additional terminal leg.

3. The power device of claim 1, wherein the arrester element is disposed within a housing of the power device.

4. The power device of claim 1, wherein the arrester element is disposed on a housing of the power device.

5. The power device of claim 1, wherein the semiconductor chip comprises one or more insulated-gate bipolar transistors (IGBTs), one or more metal-oxide-semiconductor field-effect transistors (MOSFETS), and/or one or more diodes.

6. The power device of claim 1, wherein the semiconductor chip comprises a plurality of semiconductor chips.

7. The power device of claim 1, wherein the arrester element comprises one or more varistors, one or more transient voltage suppressor (TVS) diodes, one or more thyristors, and/or one or more spark gaps.

8. A system comprising:
a power device comprising a plurality of terminal legs and a semiconductor chip that is connected to at least two terminal legs of the plurality of terminal legs;
a heat sink configured to dissipate heat generated by the semiconductor chip; and
an isolation layer configured to electrically isolate the semiconductor chip from the heat sink, wherein the power device further comprises:
an arrester element configurable to, in response to a voltage across the arrester element being greater than a threshold voltage, create a current path around the isolation layer, wherein the threshold voltage is less than a breakdown voltage of the isolation layer, and wherein, to create the current path around the isolation layer, the arrester element is configured to create a current path from the semiconductor chip to an additional terminal leg of the plurality of terminal legs that is different than the at least two terminal legs.

9. The system of claim 8, further comprising:
a current measurement device configured to measure a current flowing through the created current path.

10. The system of claim 8, wherein the semiconductor chip comprises a plurality of semiconductor chips.

11. A method comprising:
creating, by an arrester element of a power device and in response to a voltage across the arrester element being greater than a threshold voltage, a current path around an isolation layer that is configured to electrically isolate a semiconductor chip of the power device from a heat sink configured to dissipate heat generated by the semiconductor chip, wherein the power device comprises a plurality of terminal legs, wherein the semiconductor chip is connected to at least two terminal legs of the plurality of terminal legs, wherein the threshold voltage is less than a breakdown voltage of the isolation layer, and wherein creating the current path around the isolation layer comprises:
creating a current path from the semiconductor chip to an additional terminal leg of the plurality of terminal legs that is different than the at least two terminal legs.

12. The method of claim 11, further comprising:
determining, based on a current flowing created current path, that the power device is experiencing a voltage overstress; and
in response to determining that the power device is experiencing a voltage overstress, deactivating one or more components of a system that includes the power device.

13. The method of claim 11, wherein creating the current path from the semiconductor chip to the additional terminal leg comprises:
creating, by the arrester element, a current path from a bottom potential of the semiconductor chip to the additional terminal leg.

14. The method of claim 11, wherein the arrester element is disposed within a housing of the power device.

15. The method of claim 11, wherein the arrester element is disposed on a housing of the power device.

16. The method of claim 11, wherein the semiconductor chip comprises one or more insulated-gate bipolar transistors (IGBTs), one or more metal-oxide-semiconductor field-effect transistors (MOSFETS), and/or one or more diodes.

17. The method of claim 11, wherein the arrester element comprises one or more varistors, one or more transient voltage suppressor (TVS) diodes, one or more thyristors, and/or one or more spark gaps.

* * * * *